United States Patent [19]

Yamada

[11] Patent Number: 4,795,079

[45] Date of Patent: Jan. 3, 1989

[54] STRUCTURE OF JOINING PRINTED CIRCUIT BOARDS AND PROCESS FOR PRODUCING THE SAME

[75] Inventor: Akira Yamada, Kanagawa, Japan

[73] Assignee: Canon Kabushiki Kaisha, Tokyo, Japan

[21] Appl. No.: 844,822

[22] Filed: Mar. 27, 1986

[30] Foreign Application Priority Data

Mar. 29, 1985 [JP] Japan ................. 60-065451
Mar. 29, 1985 [JP] Japan ............. 60-046106[U]
Jul. 3, 1985 [JP] Japan ............. 60-102433[U]

[51] Int. Cl.⁴ .................................... H05K 3/24
[52] U.S. Cl. ...................... 228/179; 228/254; 174/88 R; 439/485; 439/876
[58] Field of Search .......... 228/180.2, 179, 254; 361/405, 406, 408, 412; 174/88 R; 439/485, 874, 875, 876

[56] References Cited

U.S. PATENT DOCUMENTS

3,374,531 3/1968 Bruce ............................ 228/222
4,316,320 2/1982 Nogawa et al. ............. 228/280.2
4,657,172 4/1987 Lee ............................... 228/180.2

FOREIGN PATENT DOCUMENTS

2019884 12/1971 Fed. Rep. of Germany ...... 361/412

Primary Examiner—Kenneth J. Ramsey
Attorney, Agent, or Firm—Toren, McGeady & Associates

[57] ABSTRACT

A structure of joining two printed circuit boards with solder. A reserve solder layer is applied on a pattern of first joint leads of the printed circuit on a base plate of the first board. A pattern of high thermal conductivity similar to the pattern of second joint leads of the second printed circuit board, is formed on the opposite or back surface of the base plate thereof substantially superposed with the second joint leads. To join the first and second boards, the second board is turned upside down and then the second joint lead pattern is put on the solder layer in registry with the first joint lead pattern of the first board. And it is at a point on each patch of the thermal conductivity pattern that heat is then applied thereto to obtain the structure between the joint leads of the two printed circuit boards.

11 Claims, 10 Drawing Sheets

STRUCTURE OF JOINING PRINTED CIRCUIT BOARDS AND PROCESS FOR PRODUCING THE SAME

BACKGROUND OF THE INVENTION

1. Field of the Invention

This invention relates to a structure of joining two printed circuit boards at their joint lead patterns electrically, and a process for producing the same.

2. Description of the Prior Art

Figure 1A:
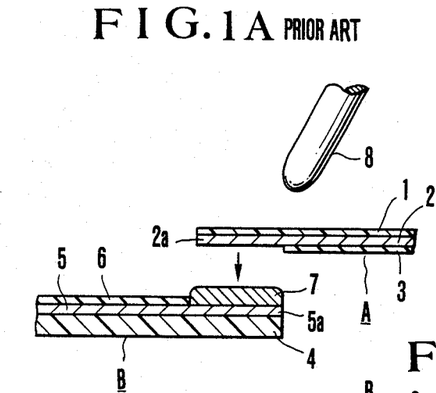
FIGS. 1A and 1B illustrate the prior known joint portions of the printed circuit boards.
Figure 1B:
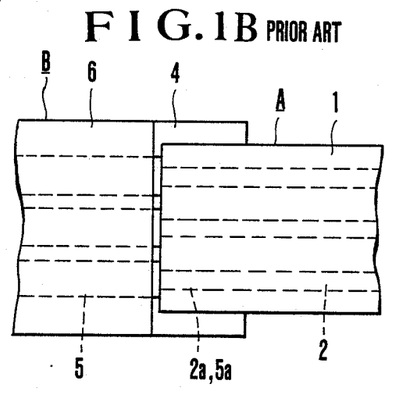

FIGS. 1A and 1B illustrate a first example of the prior known two printed circuit boards A and B to be joined. The board A has a flexible film base 1 on which is formed an electrical circuit pattern 2 with its leads 2a. The circuit pattern 2 is coated with an electrically insulating film 3 as a protective cover. The other board B has a circuit pattern 5 formed on an epoxy paper, epoxy resin plate or like base 4. This circuit pattern 5 is protected by a solder resist layer 6, but its leads 5a are left uncoated with the layer 6 to allow for later application of a reserve solder layer 7. To join these boards A and B, the board A is turned upside down as shown in FIG. 1A, and its leads 2a are placed on the solder layer 7 in registry with the leads 5a of the latter B as shown in FIG. 1B. Then, a heated soldering iron 8 is pressed on the base film 1 at a point just above each of the pairs of superimposed leads 2a and 5a through the solder layer 7 until the solder is melted.

With this prior known joining method, however, because the application of heat from the soldering iron 8 to the solder layer 7 is indirect, or through the base film 1, it takes a long time to melt the reserve solder layer 7. Also, as the melting of the solder layer 7 is often limited only to a small area just under the point of touch of the iron 8, another problem arises that good soldering between the joint leads 2a and 5a is difficult to achieve. To overcome these problems, a special soldering tool of large scale may be employed in some cases. But an alternative problem is produced in that its handling is troublesome. Besides these soldering problems, the above-described example of the prior art has the basic problem that because the solder layer 7 is in spot-contact to both joint leads 2a and 5a, the joining strength is very weak. If the strength is increased by squeezing the film base 1 with the soldering iron 8, the melted solder layer 7 is extruded from the space between the joint leads 2a and 5a in each pair. In this case, therefore, an additional problem is produced in that an erroneous bridge is formed between the adjacent two pairs of joint leads 2a and 5a.

SUMMARY OF THE INVENTION

An object of the invention is to eliminate all the above-described problems of the prior art and to provide an improved structure of joining two printed circuit boards, and a process for producing the same.

This and other objects and features of the invention will become apparent from the following description of embodiments thereof.

DESCRIPTION OF THE PREFERRED EMBODIMENTS

Figure 3:
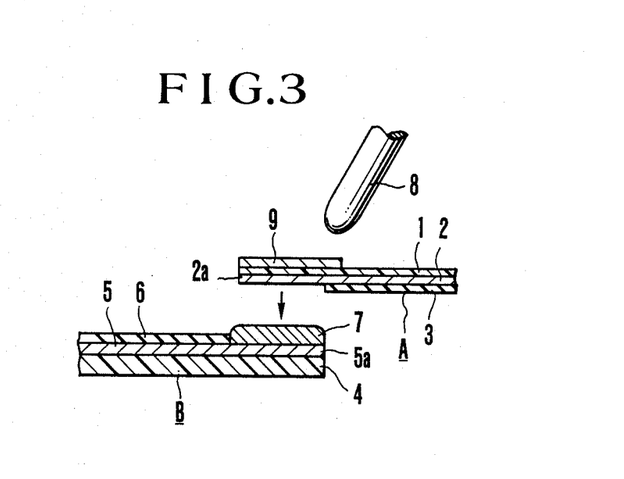
FIG. 3 is a side sectional view of a first embodiment of the structure of the joined two printed circuit boards according to the invention.
Figure 4:
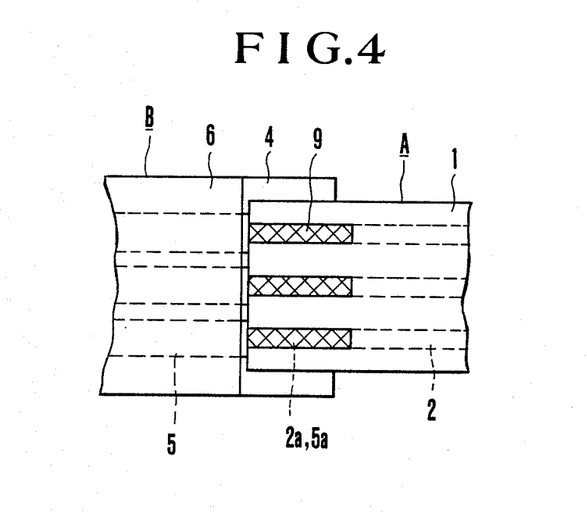
FIG. 4 is a plan view of the structure of FIG. 3.

In FIGS. 3 and 4 there is shown the first embodiment of the invention, where a flexible printed circuit board A has an electrically insulating film base 1 of flexibility with a thickness of less than 0.3 mm on which is formed an electrically conductive pattern 2 of circuit network and lands at which circuit elements are connected to the circuit network. Further applied on the pattern 2 is an electrically insulating coating 3 as a protection cover film. Another printed circuit board B is constructed, similarly to the above, an electrically insulating base 4 made of paper epoxy material, or glass epoxy material, an electrically conductive pattern 5 of similar leads to those of the pattern 2 of the first board A, formed on the base 4, and an uppermost or solder resist layer 6 formed thereon by printing means. Meanwhile, the cover film 3 is removed from the end portion of the board A to expose part of the pattern 2. This exposed part provides a pattern of joint leads 2a for electrical connection to joint leads on the other board B. The end portion of the second board B is also uncoated with the solder resist layer 6 and provides a pattern of joint leads 5a. On to each of these joint leads 5a is previously applied a reserve solder layer 7. Here, a feature of the first flexible printed circuit board A which is characteristic of the invention is that its back surface is provided at portions just opposite to the joint leads 2a with a dummy pattern of patches 9 of the same shape and size as those of the joint leads 2a as shown in FIG. 4. These patches 9 are made of material of high thermal conductivity, preferably the same material as that of the circuit pattern 2a such as copper foil.

Next explanation is given to a process for joining the above-described two boards A and B. The joint lead patterns 2a and 5a of these boards A and B are first confronted to each other and the former is put on the solder layers 7 in good registry with the latter. Then, a heated soldering iron 8 is touched on each of the copper foil patches 9 one at a time. Because heat from the iron 8 is rapidly distributed from the point of touch to the entire area of the patch 9, that part of the solder layer 7 which is under the heated patch 9 is all melted. Thus, a great increase in the strength of joining the two boards A and B can be achieved. Additional advantages arising from the use of such a dummy pattern 9 are that the soldering tool 8 itself may be of the commonly available type, for example, a sharpened iron rod shown in FIG. 3, that even with such a soldering iron rod, the entire area of each joint lead 2a the first board A is affixed to each respective solder layer 7, and that when soldering, the pressure the iron 8 applies to the patch 9 is not necessarily increased so much as to cause extrusion of the molten solder out of the space between the joint leads 2a and 5a in each pair. To facilitate avoidance of forming a solder bridge between the adjacent two pairs of joint leads 2a and 5a, despite the joint leads 2a and 5a in each pair being somewhat taken out of registry with each other, the width of the joint lead 2a is previously made narrower than that of the joint lead 5a.

Figure 5:
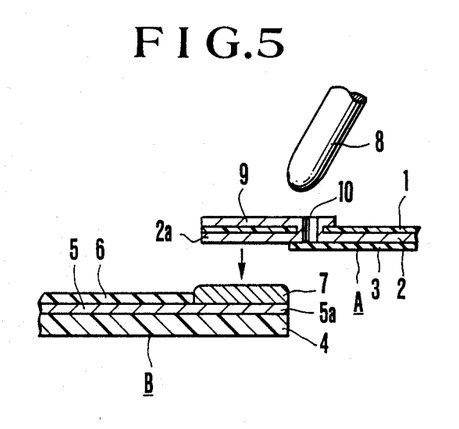
FIGS. 5 and 6 are, respectively, sectional production and top plan views of a second embodiment of the structure of joined printed circuit boards according to the invention.
Figure 6:
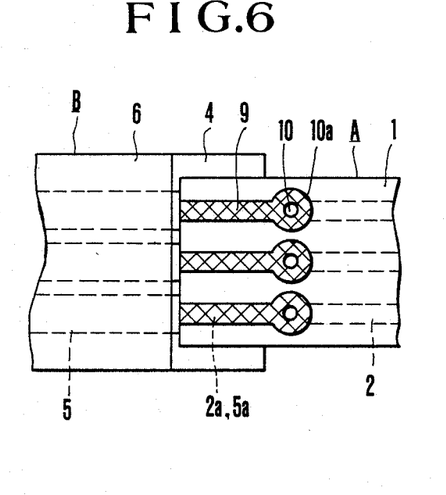

FIGS. 5 and 6 illustrate a second embodiment of the invention which is different from the first embodiment in that the dummy patch 9 is made contiguous to the joint lead 2a by a tubular thermal conductive element in a through hole 10, and that part of the dummy patch 9 which surrounds the through hole 10 is changed in shape to a circular land 10a. In this embodiment, therefore, an additional advantage is produced in that heat from the soldering iron quickly propagates to the joint lead 2a due to the thermal conduit in the hole 10 and it takes a shorter time, than in the first embodiment, to melt the entire area of that portion of the solder layer 7 which is beneath the heated joint lead 2a.

Figure 7A:
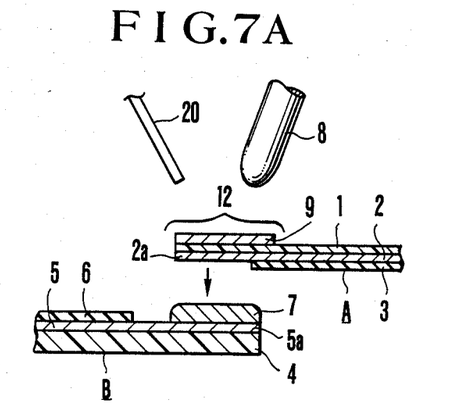
FIGS. 7A, 7B and 8 are, respectively, sectional production and top plan views of a third embodiment of the structure of joined printed circuit boards according to the invention with FIGS. 7A and 7B before and after soldered, respectively.
Figure 7B:
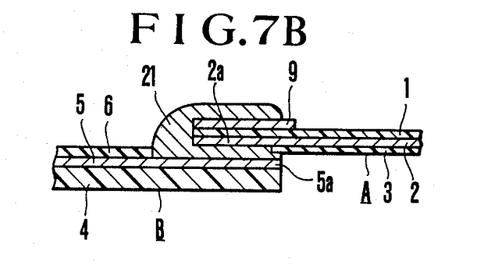
Figure 8:
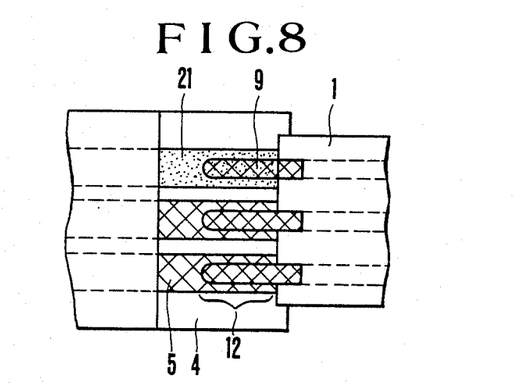

A third embodiment of the invention is shown in FIGS. 7A, 7B and 8 where the base 1 of the flexible printed circuit board A is cut out in portions surrounding the joint leads 2a so that the resultant form of the joint part of the board A becomes comb tooth-like extensions 12. The width of each of the extensions 12 is equalized to that of the joint lead 2a which, in turn, is narrower than that of the joint lead 5a as in the above-described first embodiment. The dummy patches 9 are spread over the entire area of each of the extension 12 with the base film 1 intervening therebetween, and slightly extend into the integral film base 1. The other parts are similar in construction and arrangement to those of the first embodiment, and will be no more explained here.

The process for joining the two boards A and B is as follows: The joint lead patterns 2a and 5a of the boards A and B are first brought into registering contact with each other across the reserve solder layers 7. It is to be noted here that the tips of the extensions 12 are spaced apart from the border of the solder resist coating 6. Then, the soldering iron 8 is touched on each of the dummy patches 9, while a thread of solder 20 is simultaneously fed in each case toward the tip of the iron 8. Thereby, each solder layer 7 is melted over the entire area of that portion which is just under each dummy patch 9, because it distributes head uniformly, and further a molten portion of the thread of solder 20 is spread over the entire area of the exposed portion of each joint lead 5a of the board B and also over the entire area of that portion of each dummy patch 9 which lies on each extension 12. As the thus-applied solder layer 21 combines with the underlying or reserve solder layer 7 to form a clamp for each of the joint leads 2a, an extremely strong joining of the two boards A and B is achieved. Experiments have proved that under the general condition, the reserve solder 7 and the thread of solder 20 when melted are apt to mix with each other.

What is characterized in this embodiment is that while, in the first embodiment, the joining strength between the two boards A and B relies on the surface contact with the reserve solder layer, the joining is effected not only by the surface contact but also by the clamp of three-dimensional nature, that is, a far stronger and reliable joining can be achieved. For note, though, in this embodiment, the upper molten solder layer 21 will even run over the extension 12 particularly at the side edges thereof, there is little possibility of unintentionally forming a solder bridge between the adjacent two pairs of joint leads 2a and 5a, because the width of the extension 12 is so much narrower than that of the joint lead 5a of the board B.

Figure 9:
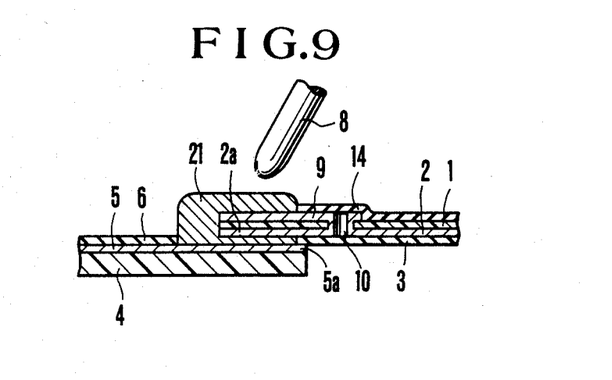
FIGS. 9 and 10 are side sectional and top plan views of a fourth embodiment of the structure of joined printed circuit boards after soldered according to the invention.
Figure 10:
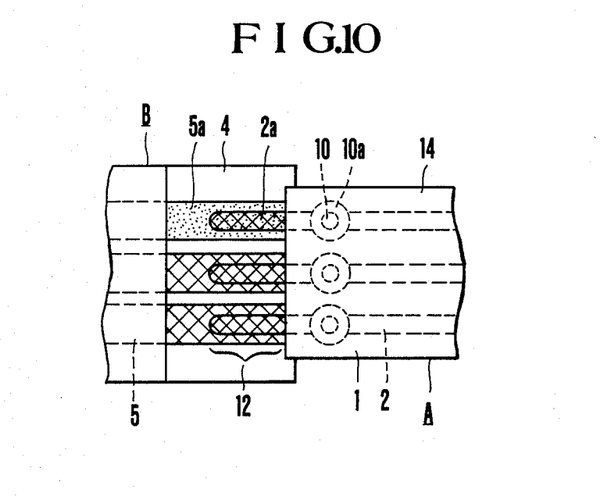

Next, a fourth embodiment of the invention is described with reference to FIGS. 9 and 10. This embodiment may be considered to be derived from the second embodiment with a modification that the joint lead pattern portion 2a of the flexible printed circuit board A is formed to comb-teeth-shaped extensions 12. Since there are the through holes 10, for the circular lands 10a of the dummy patches 9 are protected from the upper solder layer 21, as it is applied even to the upper surface of the extensions 12, the back surface of the film base 1 and the lands 10a of the dummy patches 9 are coated with a second cover film 14. The other parts are similar in construction and arrangement to those of the second embodiment.

In this fourth embodiment, the process for joining the two boards A and B is that, similarly to the third embodiment, the thread of solder 20 feeds a molten bandage between the entire areas of the exposed portions of the extension 12 and either of the joint lead 5a and the reserve solder layer 7, when the iron 8 heats the dummy patch 9. And, in this or fourth embodiment, because the heat conduit in the through hole 10 helps quick propagation of heat from the iron 8 to the joint lead 2a and therefrom to the reserve solder layer 7 just beneath it, the time necessary to complete the joining becomes shorter than in the third embodiment.

The common feature of the foregoing or first to fourth embodiments is that the dummy pattern 9 assures uniform distribution of heat over the entire area of that portion of the reserve solder layer 7 which lies just beneath the joint lead 2a with an advantage that a stronger joining can be achieved. An additional advantage arising from the use of the heat conduit between the dummy pattern 9 and the joint lead pattern 2a is that the joining time can be shortened. A furthermore advantage is that the later application of a second solder layer 21 leads to form a three-dimensional bondage across the two joint lead patterns 2a and 5a so that the reliability of joining the two boards A and B is very improved.

Though the dummy pattern 9, in the first and third embodiments, is isolated from the circuit pattern 2, or, in the second and fourth embodiments, serves as a supplementary joint lead pattern for the circuit pattern 2 on the front surface of the film base 1, it is also possible that the dummy pattern 9 functions not only as the heat conductor but also as an extended portion of a second pattern on the back surface of the base 1.

The reason why the dummy pattern 9 is given not to the board B but to the board A is that the base of the board A is a thin flexible film which has a far higher thermal conductivity than that of the thick base of the board B. But, it is to be understood that the present invention is applicable to other types of printed circuit boards whose bases may be even of the usual epoxy system, though there is a limitation to the range of thicknesses of the base.

Since boards having comb-tooth like joint portions, as shown in FIGS. 7 to 10, are manufactured by using punching and shearing means, there is a high possibility of misaligning the puncher to the pattern of the extensions, giving rise to bridging of the solder to adjacent pairs of joint lead patterns.

Figure 11A:
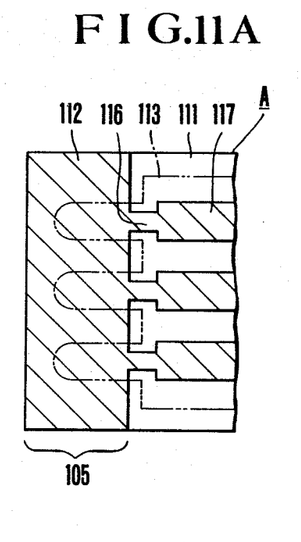
FIGS. 11A, 11B and 11C are diagrams of geometry taken to define the design parameters for making extensions of joint leads, with FIG. 11A illustrating the positioning of a puncher on a sheet in right place, FIG. 11B an ideal product, and FIG. 11C a faulty product.
Figure 11B:
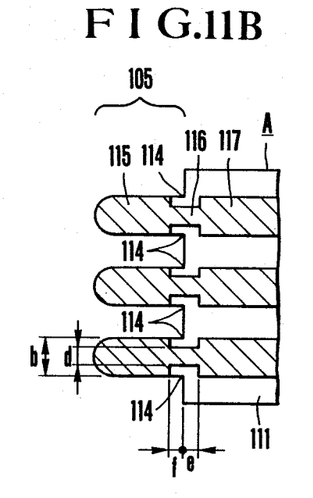

FIGS. 11A, 11B and 11C illustrate a fifth embodiment of the invention where the printed circuit board A has an electrically insulating, thin film base 111, of which only one of the surfaces bears an electrically conductive pattern 117 of circuit network. In a position of FIG. 11A, an end portion 105 of the board A is about to be sheared. This portion is entirely coated with an electrically conductive layer 112 shown by hatching. This layer 112 is contiguous to a number of, in this instance, three, leads of the circuit pattern 117 through respective necks 116 of narrower width. This board A is cut out by a puncher whose edge is indicated by a two-dot-and-one-dash line 113 to obtain the joint lead extensions of FIG. 11B. That is, the printed circuit board A of FIG. 11B has its joint portion in the form of comb-teeth shaped extensions 105 on which the joint leads of the circuit pattern 117 take their place, while the necks 116 are aligned to the roots of the extensions 105.

In the position of FIG. 11B, the central line of the extension 105 coincides with that of the joint lead 117, and the front and rear shoulders of the neck 116 are positioned at distances, f and e, respectively, almost equal to each other. In another position of FIG. 11C, because of a rough adjustment of the position of the puncher to the board of FIG. 11A, the central line of the extension 105 is erroneously displaced from that of the circuit lead 117 by a distance, $\delta$.

Figure 12A:
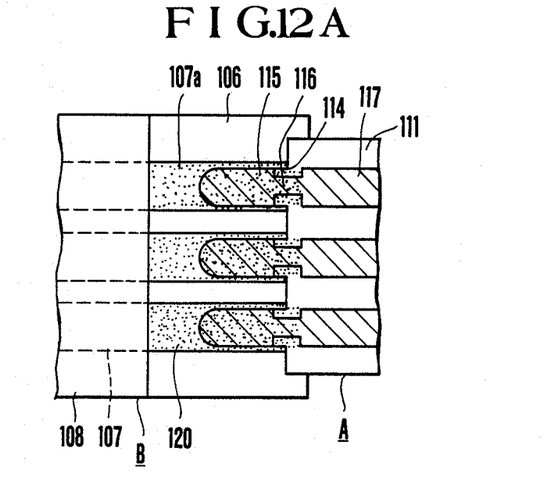
FIGS. 12A and 12B are top plan views of a fifth embodiment of the structure of joined printed circuit boards according to the invention with FIG. 12A showing an example of the extensions whose central lines coincides with those of the joint leads, and FIG. 12B showing another example of the extensions which are slightly out of coincidence with the joint leads.
Figure 12B:
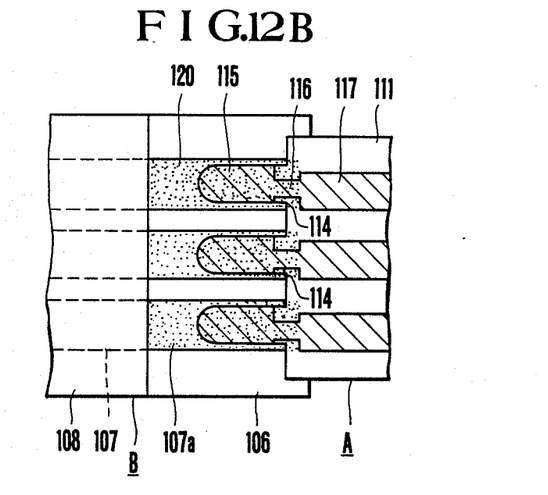

Referring next to FIGS. 12A and 12B, what joining state is attained by the above-described board A in combination with the other board B is described below.

In FIG. 12A, the board A of FIG. 11B is selected for joining with the board B. Without turning the board A upside down, its extensions 105 are placed on the exposed area 106 of the board B while the upper joint leads 115 are in exact registry with the lower joint leads 107a. A molten solder layer 120 (shown by dots in the drawing) is then applied on each pair of joint leads 115 and 107a, and then cooled, thereby an electrical conduction is established between the two patterns 115 and 107a.

What is advantageous in using the board A of the character described above is that even when the molten solder layer 120 is unintentionally extended beyond the root of the extension 105, the excess of the solder is absorbed by the recesses at the neck 116, thus preventing an erroneous bridge from being formed between the adjacent two of the pairs of joint leads 107a and 115.

Figure 11C:
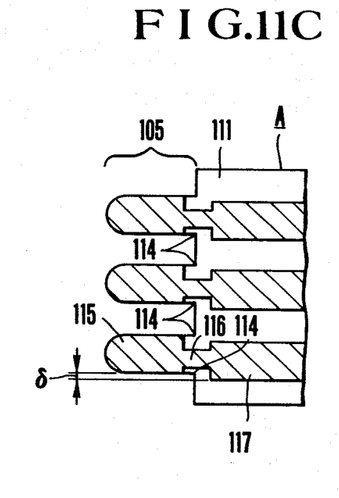

This advantage is assured even in another case shown in FIG. 12B where the board A of FIG. 11C is employed. The provision of the neck 116 has another advantage that when to heat the joint lead 115 by touching the soldering iron thereon, its temperature increases at a faster speed because the escaped amount of heat to the circuit pattern 117 is reduced, and therefore that the soldering time is shortened and the adverse effect of the heating on the circuit elements (not shown) connected to the circuit pattern 117 can be removed.

As for determination of the width, d, and length, e+f, of the neck 116, in the present state of art of high density integrations, it is preferred that $(b-d)/2 < 0.3$ mm and $e = f < 0.3$ mm are satisfied where b is the width of the extension 115.

Figure 2:
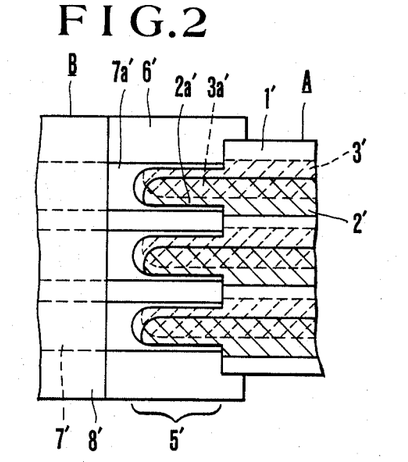
FIG. 2 illustrates a problem with joining a board having a comb-like end portion and circuit patterns on both sides thereof.

In FIG. 2, the printed circuit board A has two circuit patterns 2' and 3', on either surface of the electrically insulating film base 1', and two sets of joint leads 2a' and 3a', on either surface of the extensions 5'. The other printed circuit board B has a circuit pattern 7', on an electrically insulating base 6'. Applied on the pattern 7', is a solder resist coating 8'. A joint end portion of the board B is not coated with that resist layer 8', to expose a pattern of joint leads 7a' to air.

To join the boards A and B, while the central line of each extension 5' is in registry with that of the corresponding joint lead 7a', the comb-like end portion of the board A is put on the exposed end portion of the board B, and a molten solder layer is then applied across the joint leads 2a' and 7a', in each pair. If, however, the central lines of the two patterns of joint leads 2a' and 3a', on the upper and lower surfaces of the base 1, respectively, are displaced in opposite direction from the central line of the extensions 5', as shown in FIG. 2, however, the lateral separation between the lead 2a', in one pair and the lead 3a', in the adjacent pair will become very short at the root of the extension. As the pitch between the successive two pairs of joint leads 2a' and 3a', is usually 1.5 to 5 mm, when applying the aforesaid molten solder layer, it has often happened that a bridge is formed between the adjacent two pairs of joint leads 2a' and 3a'. This problem has been very serious when the density of integration of circuits in the board is high.

Figure 13:
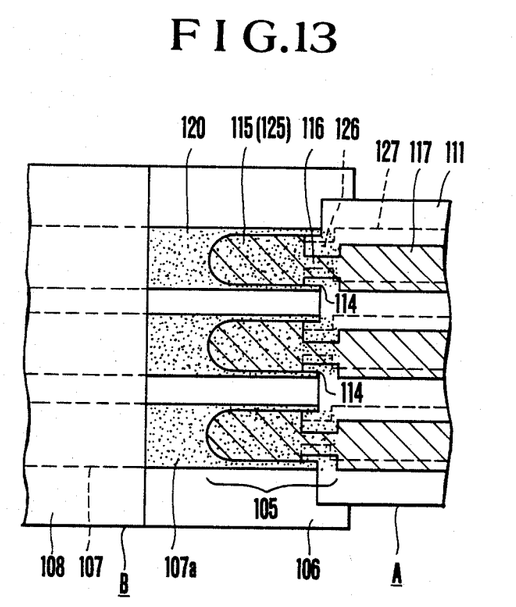
FIG. 13 is similar to FIG. 12B except that a sixth embodiment of the invention is illustrated.

FIG. 13 illustrates a sixth embodiment of the invention applied to a printed circuit board A whose back surface also has a circuit pattern 127 having joint leads 125 similar in shape and size to the joint leads 115. In the case of FIG. 13, the central line of the lead 127 is, similarly to the case of FIG. 11C, erroneously displaced from that of the extension 105 by an equal distance, $\delta$, but in opposite direction, so that the central lines of the leads 117 and 127 on the upper and lower surfaces of the base 111, respectively, are spaced apart by 2 times the distance, $\delta$. Even in such a board A of both-side patterns as shown in FIG. 13, the provision of the necks 116 and 126 can prevent any adjacent two of the pairs of circuit leads 117 and 127 from dangerously approaching each other at the roots of the extensions 105.

The common feature of the fifth and sixth embodiments is that the boundary between the joint lead 115 (125) and the circuit lead 117 (127) is narrowed in order to insure that when soldering, no erroneous bridge is formed between the adjacent two circuit leads 117, and further that no bad influence of the heating is given to the circuit elements connected thereto.

Figure 14A:
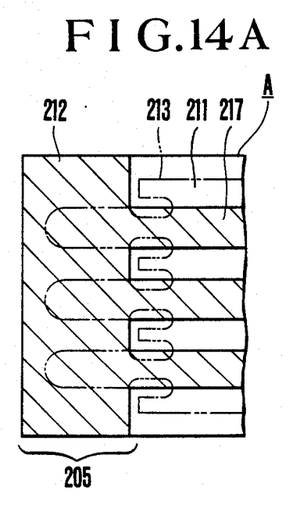
FIGS. 14A, 14B and 14C are similar to FIGS. 11A, 11B and 11C except that a seventh embodiment of the invention is illustrated.
Figure 14B:
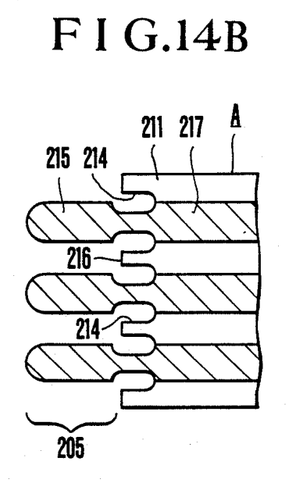
Figure 14C:
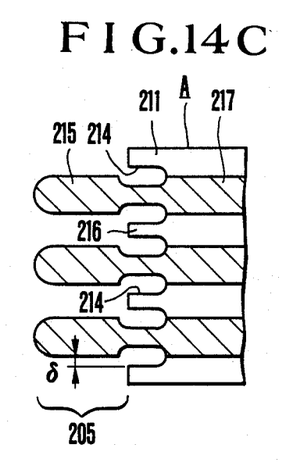

FIGS. 14A, 14B and 14C illustrates printed circuit boards as the seventh embodiment. The printed circuit board A has an electrically insulating thin film base 211 of which only one of the surfaces bears an electrically conductive pattern 217 constituting a circuit network. FIG. 14A illustrates a state before the joint portion 205 is sheared to a comb teeth shape. In this state, the area of the joint side end portion of the film base 211 is integrally coated with an electrical conductive pattern 212 contiguous to the electrically conductive pattern 217 (for note, the electrically conductive pattern areas are indicated by hatching). And, after that, the joint portion 205 of the printed circuit board A shown in FIG. 14A is sheared along a cutting contour 213 shown by 2-dot-and-1-dash lines by a punching and shearing machine to obtain another state shown in FIG. 14B. The printed circuit board A of FIG. 14B has its joint portion 205 in the form of comb teeth like extensions whose upper surface is a pattern of joint leads 215. Further, the width of the base portion of the joint lead is narrowed with formation of slit-like cutouts 214, and, at the same time, a partition 216 is constructed by the base film 211. That is, because the conductive pattern 217 of the base portion of the comb-tooth shaped joint portion 205 is deeply cut in to form the cutouts 214, the end surface of the conductive pattern of said base portion position becomes largely separated from the base portion position end surface of the adjacent joint pattern 215.

Though FIG. 14B illustrates the case that the shearing position of the comb teeth shape of the joint portion 205 is accurately made relative to the forming position of the conductive pattern 217 (212), FIG. 14C illustrates a slipped state of the shearing position by a δ quantity.

Figure 15A:
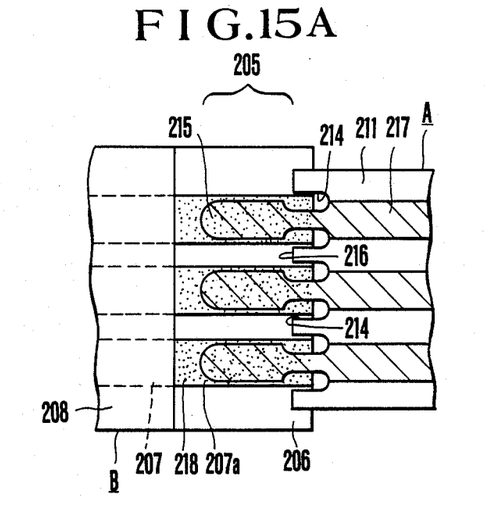
FIGS. 15A and 15B are similar to FIGS. 12A and 12B except that the seventh embodiment of the invention is illustrated.
Figure 15B:
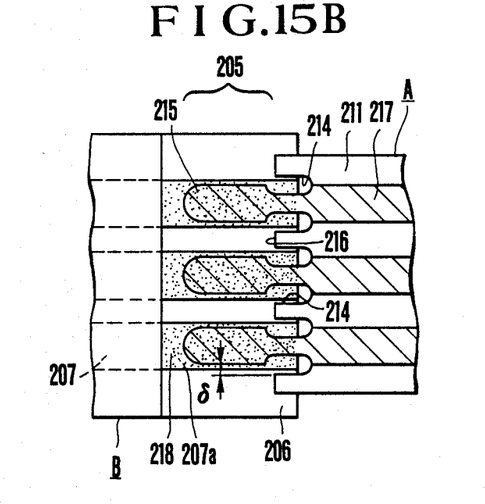

Next, by FIGS. 15A, 15B, the joining states of the above-described printed circuit board A with the other printed circuit board B are explained.

FIG. 15A illustrates a joined state by using the printed circuit board A of FIG. 14B. While each joint pattern 215 of the joint portion 205 of the printed circuit board A is in registry with each joint pattern 207a of the printed circuit board B, a solder 218 is melted and applied on both pattern 215, 207a position (shown by dots in the drawing) to obtain electrical conduction of both patterns 215 and 207a.

FIG. 15B illustrates another joined state by using the printed circuit board A of FIG. 14C. Similarly to the above-described method, electrical conduction of both patterns 215 and 207a is obtained.

What is characterized by this joined state is that even when the solder 218 adheres to the circumference of the base portion of the joint pattern 215 of the printed circuit board A, the formation of the cutouts 214 at the base portions of the joint portion 205 does not allow the solder 218 to flow into the adjacent pattern to give rise to a problem of forming an erroneous bridge despite the adjacent patterns 215 and 217 to each other at the base portions being closer to each other not only in FIG. 15A as a matter of course, but also even in FIG. 15B. Also by forming the base portions of the printed circuit board A to narrow widths, the heat of the soldering iron when touched to the joint pattern 215 in order to apply the solder 218, is reduced in the amount of radiated heat by propagation through the conductive pattern 217 constituting the circuit network. Because said joint pattern 215 only is quickly heated, a shorter soldering time suffices, and the damage of any circuit elements (not shown) connected to the conductive pattern 217 can also be prevented.

For note, in the seventh embodiment, by leaving the partition on which no pattern is formed at the base portion position of the joint portion 205, it has been made possible to more reliably prevent the solder 218 from flowing into the adjacent pattern.

As has been described above, the seventh embodiment is able to provide a structure of joining printed circuit boards in which cutouts are formed in the base portions of the comb-tooth shaped joint portions, thereby when joining by soldering means, an erroneous bridge between the adjacent patterns can be prevented, and the bad influence to the connected circuit elements can be prevented, and further a shortening of the soldering time and an improvement of the fidelity can be obtained.

What is claimed is:

1. A structure for joining printed circuit boards through a thermal welding electrically conductive material at joint pattern portions thereof, comprising:
    (a) a first printed circuit board having a first joint pattern formed on a base plate, whereby said thermal welding electrically conductive material is applied on said first joint pattern of said first printed circuit board; and
    (b) a second printed circuit board having a second joint pattern formed on a base plate, said second printed circuit board having a pattern for improving thermal conductivity formed on a surface of said base plate opposite to that on which said second joint pattern is formed and in an area almost coincident to at least said second joint pattern area.

2. A structure according to claim 1, wherein said second printed circuit board is made of a flexible printed circuit board using a film base whose thickness is no more than 0.3 mm.

3. A structure according to claim 1, wherein said pattern for improving thermal conductivity formed on said second printed circuit board is a dummy pattern.

4. A structure according to claim 1, wherein said pattern for improving thermal conductivity formed on said second printed circuit board is connected to said second joint pattern by through holes.

5. A structure according to claim 1, wherein said second printed circuit board comprises a plurality of said second joint patterns and each joint pattern is formed to a comb tooth shaped extension.

6. A structure according to claim 5, wherein said second joint pattern is connected to said pattern for improving thermal conductivity by through holes.

7. A process for joining two printed circuit boards at joint pattern portions thereof with a thermal welding electrically conductive material therebetween by applying heat from an exterior thereof to melt said conductive material, comprising the steps of:
    (a) using a first printed circuit board previously coated with said thermal welding electrically conductive material in a first joint pattern portion of a base plate and a second printed circuit board having a pattern for improving thermal conductivity formed on a back surface of a base plate having a front surface with a second joint pattern portion, said pattern for improving thermal conductivity being formed in at least an area on said back surface substantially superposed to said second joint pattern portion;
    (b) putting said first joint pattern portion of said first printed circuit board on said second joint pattern portion of said second printed circuit board; and
    (c) applying heat to said pattern for improving thermal conductivity of said second printed circuit board to melt said thermal welding electrically conductive material, whereby said first joint pattern portion and said second joint pattern portion are joined with each other.

8. A process for joining two printed circuit boards with a thermal welding electrically conductive material between joint pattern portions thereof by applying heat from an exterior thereof to melt said electrically conductive material so that said joint pattern portions are joined with each other, comprising the steps of:

(a) using a first printed circuit board previously coated with said thermal welding electrically conductive material in a first joint pattern portion on a base plate, and a second printed circuit board having a pattern for improving thermal conductivity formed on a surface of a base plate opposite to that having a second joint pattern portion, said pattern for improving thermal conductivity being formed in at least an area on said surface substantially superposed to said second joint pattern portion;

(b) putting said first joint pattern portion of said first printed circuit board on said second joint pattern portion of said second printed circuit board; and (c) continuing to apply heat to said pattern for improving thermal conductivity of said second printed circuit board; and (d) feeding new thermal welding electrically conductive material while being melted to said first and second joint pattern portions positions until they are joined.

9. A structure according to claim 1, wherein said thermal welding electrically conductive material is made of solder.

10. A method according to claim 7, wherein said thermal welding electrically conductive material is made of solder.

11. A method according to claim 8, wherein said thermal welding electrically conductive material is made of solder.

* * * * *